(12) United States Patent
Morand

(10) Patent No.: US 9,692,483 B2
(45) Date of Patent: Jun. 27, 2017

(54) COMMUNICATION DEVICE USING POWER LINE COMMUNICATION AND FREQUENCY-DIVISION MULTIPLEXING ON A PILOT LINE, AND RELATED SYSTEMS

(71) Applicant: Peugeot Citroen Automobiles SA, Velizy Villacoublay (FR)

(72) Inventor: Nicolas Morand, Courbevoie (FR)

(73) Assignee: PEUGEOT CITROËN AUTOMOBILES SA, Velizy Villacoublay (FR)

( * ) Notice: Subject to any disclaimer, the term of this patent is extended or adjusted under 35 U.S.C. 154(b) by 633 days.

(21) Appl. No.: 14/346,938

(22) PCT Filed: Sep. 26, 2012

(86) PCT No.: PCT/FR2012/052155
§ 371 (c)(1),
(2) Date: May 16, 2014

(87) PCT Pub. No.: WO2013/045823
PCT Pub. Date: Apr. 4, 2013

(65) Prior Publication Data
US 2014/0355698 A1    Dec. 4, 2014

(30) Foreign Application Priority Data

Sep. 27, 2011 (FR) ...................... 11 58610

(51) Int. Cl.
*B60L 11/18* (2006.01)
*B60R 16/03* (2006.01)
(Continued)

(52) U.S. Cl.
CPC .......... *H04B 3/542* (2013.01); *B60L 11/1838* (2013.01); *B60R 16/00* (2013.01);
(Continued)

(58) Field of Classification Search
CPC ...... B60L 11/18; B60L 11/1838; B60R 16/00; B60R 16/03; H02J 7/04; H04B 3/54;
(Continued)

(56) References Cited

U.S. PATENT DOCUMENTS 4,193,129 A * 3/1980 Wiggins ................. G01S 7/521
                                                          320/137
4,639,609 A   1/1987 Floyd et al.
(Continued)

FOREIGN PATENT DOCUMENTS

EP       1865623 A1    12/2007
EP       2228882 A2     9/2010
(Continued)

OTHER PUBLICATIONS

Society of Automotive Engineers, Inc., SAE International, SAE J1772 Surface Vehicle Recommended Practice, SAE Electric Vehicle Conductive Charge Coupler, Issued Oct. 1996; Revised Nov. 2001.

(Continued)

*Primary Examiner* — Levi Gannon
(74) *Attorney, Agent, or Firm* — Polster, Lieder, Woodruff & Lucchesi, LC

(57) ABSTRACT

The invention relates to a communication device using power line communication provided in a first system coupled to a second system via a power cable comprising a pilot line having a first impedance, which encounters at least second and third impedances and through which a first analog signal passes in a first frequency band. The device is arranged so as to: i) generate, from a local digital signal, a second analog power line communication signal having frequencies included in a second frequency band that has minimal overlap with the first frequency band; ii) supply the second analog signal to the pilot line via a capacitive means (Continued)

and iii) extract, from the analog signals passing through the pilot line, each second analog signal in order to convert the latter into a digital signal to be processed by the system.

15 Claims, 2 Drawing Sheets

(51) Int. Cl.
*H02J 7/04* (2006.01)
*H04B 3/54* (2006.01)
*B60R 16/00* (2006.01)
*H03M 1/00* (2006.01)

(52) U.S. Cl.
CPC ............... *B60R 16/03* (2013.01); *H02J 7/04* (2013.01); *H03M 1/001* (2013.01); *H04B 3/546* (2013.01); *B60L 2200/26* (2013.01); *H04B 2203/547* (2013.01); *H04B 2203/5408* (2013.01); *H04B 2203/5429* (2013.01); *H04B 2203/5458* (2013.01); *Y02T 10/7005* (2013.01); *Y02T 10/7072* (2013.01); *Y02T 90/121* (2013.01); *Y02T 90/128* (2013.01); *Y02T 90/14* (2013.01); *Y02T 90/16* (2013.01); *Y02T 90/163* (2013.01)

(58) Field of Classification Search
CPC .................. H04B 3/542; H04B 3/546; H04B 2203/5404; H04B 2203/5408; H04B 2203/5429; Y02T 10/7072; Y02T 90/121; Y02T 90/128; Y02T 90/14; Y02T 90/16; Y02T 90/163
USPC .................................................. 307/9.1, 10.1
See application file for complete search history.

(56) References Cited

U.S. PATENT DOCUMENTS

| | | | |
|---|---|---|---|
| 8,767,867 B1* | 7/2014 | Castor-Perry | H04L 27/12 363/21.1 |
| 2003/0018840 A1* | 1/2003 | Chandler | H01R 29/00 710/100 |
| 2006/0170285 A1 | 8/2006 | Morimitsu et al. | |
| 2008/0055058 A1 | 3/2008 | Nishiyama | |
| 2009/0184689 A1* | 7/2009 | Kressner | G01R 22/063 320/162 |
| 2010/0094493 A1* | 4/2010 | Atsumi | F02D 29/06 701/22 |
| 2010/0164439 A1 | 7/2010 | Ido | |
| 2012/0193983 A1 | 8/2012 | Yukizane et al. | |
| 2012/0224645 A1* | 9/2012 | Kemmler | H02M 5/293 375/257 |
| 2013/0029595 A1* | 1/2013 | Widmer | H04B 5/0031 455/39 |
| 2015/0303737 A1* | 10/2015 | Steinbuchel, IV | B60L 3/0069 320/109 |

FOREIGN PATENT DOCUMENTS

| | | |
|---|---|---|
| KR | 100963793 B1 | 6/2010 |
| WO | 2011045925 A1 | 4/2011 |

OTHER PUBLICATIONS

International Search Report of corresponding application PCT/FR2012/052155 mailed Nov. 28, 2012.
International Preliminary Report on Patentability from corresponding application PCT/FR2012/052155 mailed Apr. 1, 2014.
Van Den Bossche, Omar, and Mierlo, Trends and Development Status of IEC Global Electric Vehicle Standards, Journal of Asian Electric Vehicles, vol. 8, No. 2, 2010.

* cited by examiner

COMMUNICATION DEVICE USING POWER LINE COMMUNICATION AND FREQUENCY-DIVISION MULTIPLEXING ON A PILOT LINE, AND RELATED SYSTEMS

CROSS-REFERENCE TO RELATED APPLICATIONS

This is the US National Stage under 35 U.S.C. §371 of PCT/FR2012/052155, filed Sep. 26, 2012, which, in turn, claims priority to French Application No. 1158610 filed Sep. 27, 2011.

BACKGROUND

The invention relates to the voltage supply of certain systems by other systems, via a power cable.

As is known to those skilled in the art, certain systems such as certain vehicles, such as cars, must be recharged by other systems, such as for instance a recharge point (recharge terminal or outlet), in order to be able to continue operating, at least partially.

For instance, in a non-limiting case of a hybrid or fully electric vehicle, the electrical connection of the vehicle to a recharge point is aimed at permitting the recharging of its (their) rechargeable electric battery or batteries.

In particular, but not exclusively, the invention is aimed at the alternating power supply.

In certain countries or regions, standards govern the power supply of certain systems.

This is the case for the ISO/IEC 61851-1 standard that relates to the recharging of electric batteries for vehicles. This standard defines four "charge modes", one for DC voltage and three for AC voltage (mode 1: direct charge using a simple outlet, for instance, domestic; mode 2: charge using a simple outlet, for instance domestic, through a box that is part of the interconnecting power cable; mode 3: charge using a public or private recharge terminal, more complex than a simple outlet).

For mode 3, the recharge terminal provides a high current voltage if and only if an adequate communication is established on a so-called "pilot" line that is part of the interconnecting power cable and comprising a pilot wire and a ground wire, forming together a part of a simple communication network between the recharge terminal and the vehicle. The communication can also permit the recharge terminal to indicate at the vehicle the maximum current value that the recharge terminal can provide vehicle with.

More specifically, in this mode 3, the recharge terminal generates, going to the vehicle, a rectangular signal (for instance with a frequency equal to 1 kHz), for which the pulse width is representative of the maximum current value that it can provide to the vehicle. This signal is of the PWM (pulse width modulation) type. At the vehicle, the electric link with the pilot line is coupled, on the one hand to an analysis module, and on the other hand, to at least a diode and a first resistance mounted in series (one can also provide for a second resistance and a switch mounted in parallel to the first resistance).

Since the first resistance is coupled to the ground wire and to ground (generally the chassis), it permits, when the vehicle-recharge terminal coupling is in good order (especially with respect to ground), to signal this conformity to the recharge terminal. The analysis module is asked to measure the pulse width of the rectangular signals of the first signal (at all times during the charge) in order to determine the maximum current value offered by the recharge terminal so as never to consume a recharge current exceeding this maximum available value. One will observe that the latter is generally situated between 6 Amp and 80 Amp per phase.

The second resistance and the switch are called upon to signal to the recharge terminal whether or not it is authorized to supply power to the vehicle, according to whether the switch is open or closed. One will notice that in the absence of a second resistance and switch as soon as the vehicle-recharge terminal is established in good order, the recharge terminal can supply current.

One will also observe that a vehicle-recharge communication similar to the one described is implemented in mode 2 above via the interconnecting power cable box.

When the vehicle and the recharge terminal (for instance) must exchange information other than the information related to the maximum current value available, such as, for instance, information related to the billing of the recharge or to the available electric power management, another communication must be established between them. This other communication can take place through two modems on the vehicle and the recharge terminal, respectively, generally via the technique called PLC ("Power Line Communication"). In particular, according to the technologies known to one of ordinary skill in the art, these modems are connected to one of the links of the vehicle and the recharge terminals that are dedicated to the power lines, generally via analog coupling circuits (comprising capacitors and/or electromagnetic cores) so as not to interfere with the power supply and so as not to disturb the first signal that flows through the pilot line. Unfortunately, this type of communication on a power line induces high crosstalk in many instances and consequently, the information exchange can be picked up relatively easily by communication equipment located near the vehicle and the recharge terminal, such as nearby vehicle modems, which harms the confidentiality and the safety of the transactions.

SUMMARY

Consequently, the purpose of the invention is to improve the situation, and in particular the exchange of information between two systems when one of the systems supplies the other system with electric current over an (interconnecting) power cable.

For that purpose for instance, the invention proposes a power line communication device, aimed at equipping a system that is suited to be coupled to another system via a power cable that includes a pilot line with a so-called characteristic first impedance, which encounters at least second and third impedances (respectively in these two systems) in which flows a first analog signal located on the first frequency band.

This communication device is characterized by the fact that it is arranged:

To generate from a local digital signal (coming from its system) a second analog power line communication signal having frequencies included in a second frequency band that overlaps the first frequency band as little as possible.

To supply the pilot line with the second analog signal via capacitive means, and To extract from the analog signals that are passing through the pilot line each second analog signal in order to convert it into a digital signal to be processed by its system.

Thanks to this communication device, from now on, one can inject onto the pilot line power line communication and frequency-division multiplexing signals with other analog signals, which permits a very substantial reduction of the crosstalk.

The communication device according to the invention can comprise other features that can be taken separately or in combination, such as:

The capacitive means can present a fourth impedance which is strictly lower than the first, second and third impedances;

The communication device can include, firstly, conversion means for converting an analog signal into a digital signal and vice-versa, secondly, first generation means suited to generate each second analog signal from a local analog signal provided by the conversion means, and to supply its capacitive means with each second analog signal generated, thirdly, from first filtering means for extracting each second analog signal analog signals that are passing through the pilot line, and fourthly, second generation means suited to generate from each second analog signal extracted an analog signal to be converted into a digital signal by the conversion means, for processing by the system:

The first generation means can include, on the one hand, first interface means arranged to generate a first analog differential power line communication signal from an analog signal provided by the conversion means, and on the other hand, a first voltage generator arranged to generate a second analog power line communication signal from a first differential analog signal generated by the first interface means, and to supply the capacitive means with this second generated analog signal;

the second generation means can include, on the one hand, a second voltage generator arranged to generate a second analog differential power line communication signal from a second analog signal extracted by the first filtering means, and on the other hand, second interface means arranged to generate an analog power line communication signal to be converted into a digital signal by the conversion means, from a second analog differential signal provided by the second voltage generator;

The first filtering means can be arranged to extract from analog signals passing through the pilot line second analog signals for which the second frequency ban is higher than the first frequency band.

The invention also proposes a system, on the one hand, suited to be coupled to another system via a power cable that comprises a pilot line having a first impedance, which encounters at least second and third impedances (respectively in these two systems) and through which flows a first analog signal situated in its first frequency band, and, on the other hand, comprises a power line communication device of the type presented above and to be coupled to this pilot line.

This system according to the invention can include other features that can be taken separately or in combination, namely:

for an embodiment, it can constitute at least a part of a recharge terminal and comprise generation means arranged to generate the first analog signal:

The generation means can be arranged to generate a first analog system of the Pulse Width Modulation type (or PWM) in which the pulse width is representative of the maximum value of a current that the recharge terminal is capable of providing;

The generation means can be arranged to generate a first analog signal that is rectangular in shape with rounded transitions;

The generation means can comprise, firstly, a generator arranged to generate a rectangular signal with a first basic frequency situated at the bottom of the first frequency band, secondly, switching means arranged to modify the passage of the signal generated by the generator during a small part selected from each of its transitions so as to round them off and thirdly, second filtering means arranged to apply a low-pass type filtering to the signal delivered by the switching means so as to increase the duration of their rounded transitions;

For a second embodiment, it can constitute a least a part of a vehicle, such as a car, and comprise management means arranged to extract from the analog signals that pass through the pilot line each first analog signal in order to deduct from the latter the maximum value of a current that the other system can provide, and to authorize or prohibit this supply of current at least on the basis of this deducted maximum value;

the management means can be arranged to manage the power supply to one or several rechargeable electric battery or batteries that are part of the vehicle;

It can comprise processing means arranged to provide local digital signals that must be transformed into second analog signals to be transmitted, and to process digital signals resulting from the conversion of second analog signals extracted from the pilot line.

DESCRIPTION OF THE DRAWINGS

Other features and advantages of the invention will appear when examining the detailed description below, and of the attached drawings, where.

The attached drawings serve not only to complete the invention, but to also contribute to its definition, as applicable.

DETAILED DESCRIPTION

The purpose of the invention is among other, to offer a communication device Di (i=1 or 2) aimed at equipping a system Si to be supplied with power by another system Si' (i'≠i) via an (interconnection) power cable CE or having to supply power to another system Si' via an (interconnection) power cable CE.

From what follows, as a non-limiting example, one assumes that the (first) system S1 that provides the voltage supply is a recharge terminal (public or private) and that the (second) system S2 that must be supplied with power is an automotive vehicle having a rechargeable electric battery (such as for instance a hybrid or an all-electric vehicle). But the invention is not limited to these system types. It relates indeed to all systems that can be interconnected via a power cable with a pilot line for a power supply requiring the exchange of information of various types. As such, the invention relates also to buildings, industrial and public facilities, aeronautics, consumer electronics devices, railroads and in general, all pilot line power supply systems.

Figure 1:
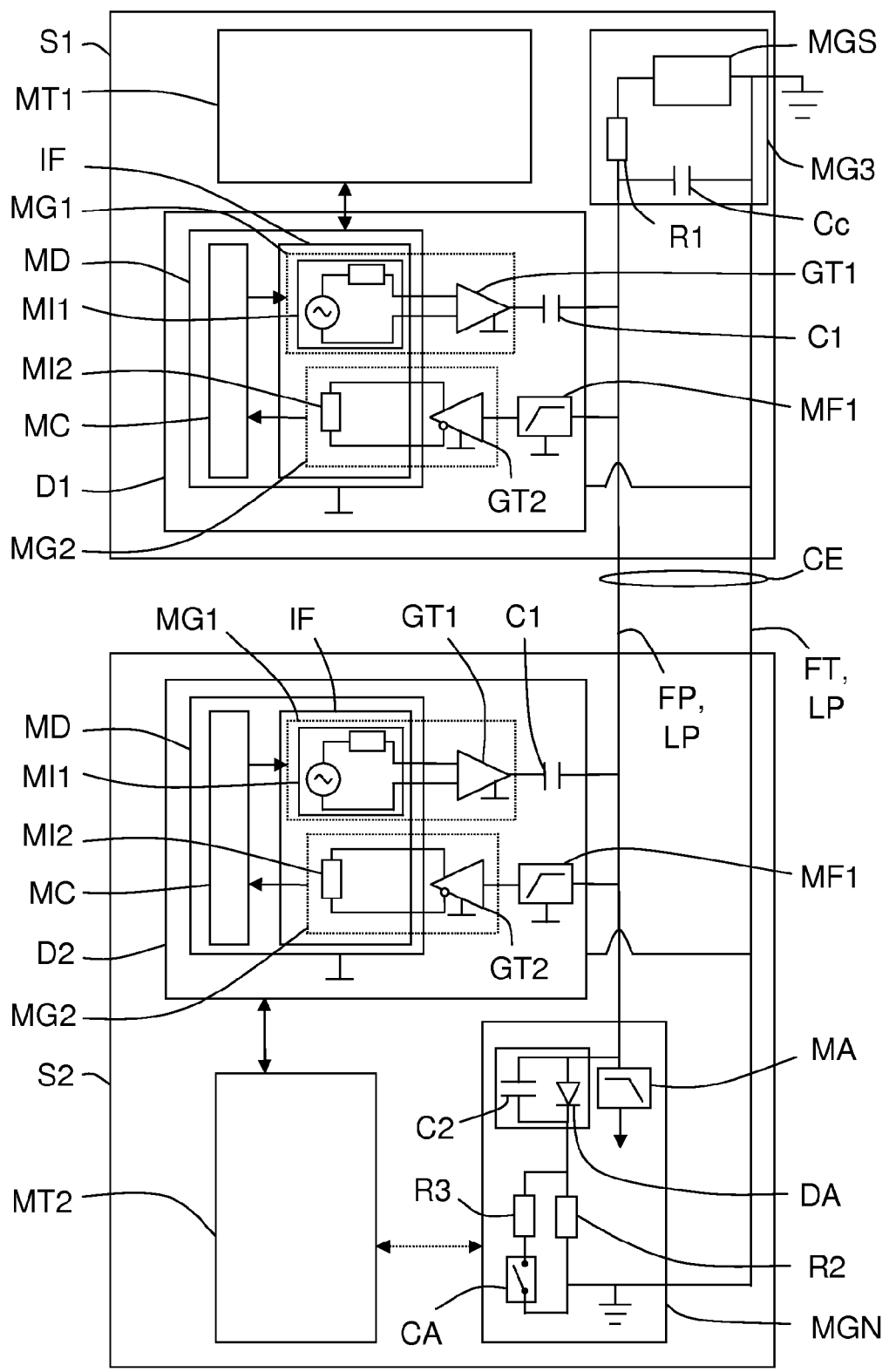
FIG. 1 illustrates schematically and functionally a first system constituting a recharge terminal, equipped with an example of an embodiment of a communication device and coupled, via a power cable, to a second system constituting a vehicle and equipped with a similar example of an embodiment of the communication device.

FIG. 1, represents schematically a first system S1 (representing here a recharge terminal) and a second system (representing here a vehicle with a rechargeable battery or batteries), interconnected one to the other by a power cable CE (here dedicated for supplying power).

This power cable CE comprises a so-called pilot line (LP) with a pilot wire FP and a ground wire FT and showing a first impedance, and power lines (not represented and called upon to supply power to vehicle S2).

Recharge terminal S1 comprises at least a generation module MG3 and a communication device D1 as well as preferably processing means MT1.

The processing means MT1 (i=1) can comprise a computer (or an electronic computing unit). The processing means MT1 arranged on the one hand to provide locally (in other words at recharge terminal S1 and in particular at its communication device D1) local digital signals that must be transformed into (second) analog signals that must be transmitted to vehicle S2, and on the other hand, to process digital signals that result from the local conversion by the communication device D1 of (second) analog signals extracted from power cable CE and coming from vehicle S2.

Generation module MG3 comprises among others generation means MGS that is arranged to generate a (first) analog signal in a first frequency band f1. In the application of the example, the lowest frequency f1 can be equal to 1 kHz (but other frequencies can be used (higher or lower than 1 kHz)).

Preferably, the generation means MGS is arranged to generate a first analog signal of the so-called ("Pulse Width Modulation") PWM type. In the application of the example, the pulse width of the first analog signal is representative of the maximum current value that the recharge terminal S1 is capable of providing at that time to vehicle S2.

Figure 3:
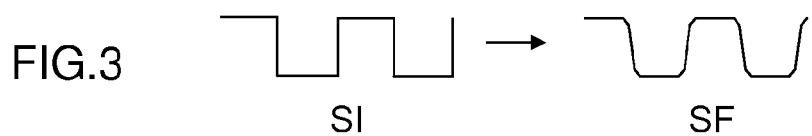
FIG. 3 illustrates schematically the result of processing of a rectangular signal by the generation means of FIG. 2.

Even more preferably, the generation means MGS can be arranged so as to generate a first analog signal that has a rectangular shape in general with rounded transitions of the type schematically illustrated in the right part SF of FIG. 3.

Figure 2:
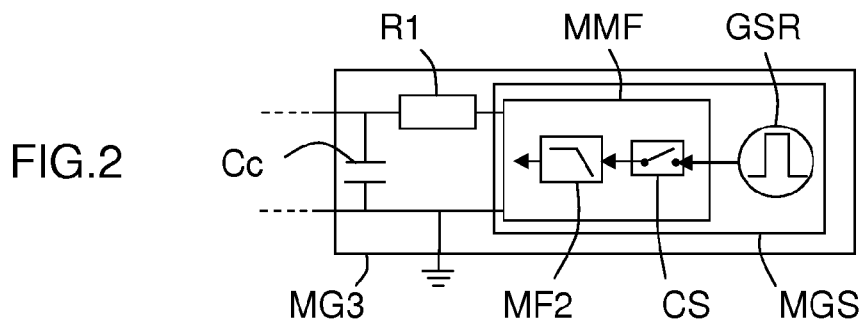
FIG. 2 illustrates schematically and functionally an example of an embodiment of generation means of the first analog signal of the first system of FIG. 1.

Such a rectangular signal with rounded transitions SF can be generated by generation means MGS which are for instance of the type of those illustrated in FIG. 2. More specifically, in the non-limiting example illustrated in FIG. 2, the generation means MGS comprise a generator GSR and shaping means MMF comprising for instance commutation means CS and (second) filtering means MF2.

Generator GSR is arranged to generate an initial signal SI of rectangular in shape (as illustrated schematically in the left part of FIG. 3) and having the lowest frequency of the first frequency band f1. This generator GSR can also comprise an oscillator.

The commutation means CS are arranged to modify the passage of the initial signal SI which is generated by generator GSR for a short part selected from each of its transitions in order to round off the latter. Here, "transition" means a sudden voltage change, in other words with a strong gradient. One shall understand that the commutation permits to round off the beginning and the end of each of the transitions when the opening time and closing time are sufficiently long. These communication means CS can for instance comprise an electronic sub-system with transistor(s) and/or operational amplifier(s).

Second filtering means MF2 are arranged to apply filtering of the low-pass type to the rounded transition signal which is delivered by the communication means CS so as to increase the duration of their rounded transitions. They deliver at the output what is called here the first analog signal SF. This filtering can for instance be achieved by an RLC type filter.

Shaping the initial PWM signal SI by generation means MGS, according to the invention, permits the reduction of its spectral bandwidth beyond its first basic frequency which in this case, is also the lowest frequency of the first frequency band f1, and consequently, to reduce the interferences with the second analog signals SC which are added to the pilot line LP by frequency multiplexing, as will be seen below. This is true not only during the transitions, thanks to the increase of their duration, but also for any time interval that surrounds the beginning or the end of a transition, thanks to the rounding.

Generation means MGS comprises a first terminal connected to the recharge terminal S1 link which corresponds to pilot line LP, through a first resistance R1 and a second terminal connected to ground and to the recharge terminal S1 link which corresponds to ground wire LT. In addition, the terminal of the first resistance R1, which is opposite the one connected to one of the output terminals of the generation means MGS, is coupled to the other output terminal of these generation means MGS and to ground, through a capacitive component Cc.

The first resistance R1 and the capacitive component Cc are part of the generation module MG3 with generation means MGS.

Vehicle S2 comprises at least the management means MGN and a communication device D2, as well as preferably processing means MT2.

Processing means MT2 (i=2) can comprise a computer (or of an electronic computing unit). The processing means MT2 is arranged, on the one hand, to provide locally (in other words to vehicle S2, and in particular to its communication device D2) local digital signals that will have to be transformed into (second) analog signals to be transmitted to the recharge terminal S1 and, on the other hand, to process digital signals resulting from the local conversion by the communication device D2 of (second) analog signals SC extracted from pilot line LP and coming from recharge terminal S1.

Management means MGN is arranged to extract (first SF and second SC) analog signals which pass through the power cable CE on the pilot line LP, only the first analog signals SF to deduce from the latter the maximum value of a current which the recharge terminal S1 is capable of supplying to vehicle S2. It is also arranged to authorize or prohibit this current supply, at least on the basis of the maximum value deduced, from an extracted first signal SF.

This extraction can take place by means of an analysis module MA to ensure a filtering function which will be explained below.

Management means MGN is also arranged to manage the voltage supply of vehicle S2 and here more specifically of its rechargeable electric battery (under the control of a non-represented battery charger and of which it may be part). To do so, as illustrated without limitation, it can comprise at least a diode DA, coupled to the vehicle S2 link which is coupled to the pilot line LP and a second resistance R2 coupled to diode DA and to ground (coupled to ground wire LT).

When the vehicle S2-recharge terminal S1 interconnection is in good order (in particular with respect to ground), the second resistance R2 may signal this conformity to the recharge terminal S1.

As illustrated without limitation on FIG. 1, the management means MGN can also comprise beneficially a third resistance R3 and a switch CA mounted in parallel of the second resistance R2. This third resistance R3 and this switch CA are used to signal to the recharge terminal S1 if it is authorized or not to supply power to the vehicle. One will understand that a supply authorization is given when switch CA is closed, while a supply is prohibited when switch CA is open.

In addition, as illustrated without limitation on FIG. 1, the management means MGN can also comprise beneficially a capacitor C2 mounted in parallel to diode DA, in order to render the impedance of pilot line LP (constituted by the pilot wire FP and the ground wire FT) during the high states of the first analog signal SF closest to that which it has during the low states of the first analog signal SF.

One will observe that processing means MT2 may be coupled to management means MGN as illustrated without limitation, in order to exchange information or instructions.

Also, one will observe that by reason of the arrangements described above of the recharge terminal S1 and of the vehicle S2, the power cable CE encounters at least on a first end a second impedance corresponding to the one of the first resistance R1 and for a second end (opposite the first one), when the diode DA is conducting, and for a first approximation comprises overlooking the non-linear effects due to this diode DA, a third impedance corresponding to that of the second resistance R2, as well as possibly a fifth impedance corresponding to that of the third resistance R3.

The communication devices Di (i=1 or 2) that equip respectively the recharge terminal S1 and the vehicle S2, are substantially identical.

According to the invention, a communication device Di is arranged to achieve at least three functions.

A first function comprises generating from a local digital signal (provided by the possible associated processing means MTi) a second analog power line communication signal SC having frequencies falling within a second frequency band that overlaps as little as possible (and preferably not at all or negligibly) the first frequency band f1 (of the first analog signal SF).

Consequently, the (communication) device Di is required to frequency multiplex on the pilot line LP the second analog signals SC (that it generates) with the first analog signals SF (generated by the recharge terminal S1).

Preferably, the frequency band of the second analog signals is situated above the first frequency f1. But for an embodiment variation, it could be situated below the first frequency band f1 according to a mirror device.

As a non-limiting example, the bandwidth of the second analog signals can fall within approximately 2 MHz and approximately 30 MHz.

A second function comprises supplying the pilot line LP with each generated second analog signal SC via capacitive means C1 having a fourth impedance, which is preferably strictly lower than the first, second and third impedances (for the pilot line LP, of first resistance R1 and second resistance R2, respectively), as well as also than the fifth impedance of the possible third resistance R3.

As an example, the fourth impedance (output) of the (communication) device Di can be ten times to one hundred times smaller than those of the first, second, third and possible fifth impedances.

This is justified by the fact that the output of the capacitive means C1 is coupled to the link of recharge terminal S1 or of vehicle S2 which corresponds to pilot line LP, and consequently the capacitive means C1 defines a dividing bridge with the first R1, second R2 and possible third R3 resistances.

A third function comprises extracting from the (first SF and second SC) analog signals that flow through pilot line LP, only the second analog signals SC in order to convert them into digital signals to be processed by the Si system (for instance by its processing means MTi).

In order to achieve the first and third functions, the device Di can, as illustrated without limitation in FIG. 1, comprise conversion means MC, first generation means MG1, second generation means MG2 and first filtering means MF1.

Conversion means MC is arranged to convert each analog signal into a digital signal to be processed locally (for instance by the associated processing means MTi) and each local digital signal (for instance provided by the associated processing means MTi) into an analog signal. This is a modem type function (modulation/demodulation).

The first generation means MG1 is arranged to generate each second analog signal SC from a local analog signal provided by the conversion means MC and to feed the capacitive means C1 with each generated second analog signal SC so that it injects them onto the pilot line LP.

To do so, and as illustrated without limitation in FIG. 1, the first generation means MG1 can comprise first interface means MI1 and a first voltage generator GT1 coupled one to the other.

The first interface means MI1 is arranged to generate a first analog signal and by example differential, line carrier currents from an analog signal provided by the conversion means MC.

When the first signal is differential, one of the two differential outputs of the first interface means MI1, for instance that of high O+, delivers an analog signal $V_{o+}$ with respect to ground; the other differential output of these first interface means MI1, for instance that of the low O−, delivers a $V_{o-}$ analog signal with respect to ground.

Preferably, the output impedance Z0 of the first interface means MI1 is less than or equal to about 10Ω.

Figure 4:
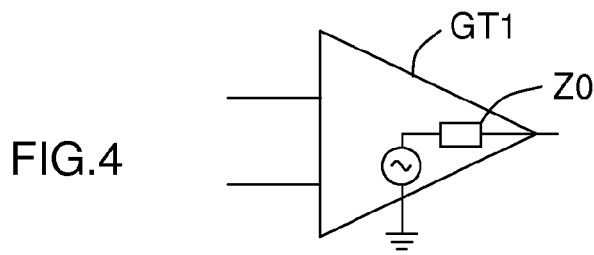
FIG. 4 illustrates schematically and functionally an example of an embodiment of the voltage generator of the first generation means of the communication devices of FIG. 1.

The first voltage generator GT1 is arranged, on the one hand, to generate a second analog power line signal SC from a first analog differential signal generated by the first interface means MI1, and on the other hand, to feed the capacitive means C1 with the second analog signal SC that it has generated. Such a first voltage generator GT1 can for instance comprise an operational amplifier with a setup of the type of the one illustrated in FIG. 4 (in other words with an output impedance Z0 and a voltage generator mounted in series between its output terminal and ground, so that its output is equivalent to a voltage source referenced with respect to ground and internal impedance Z0).

The output of the first voltage generator GT1 delivers a second analog signal SC that is equal to the voltage of O+ ($V_{o+}$) less the voltage of O− ($V_{o-}$) plus ground (GND), or SC−GND=$V_{o+}$−$V_{o-}$. One will observe that the pilot line LP is referenced with respect to the same potential as ground GND of the first generation means MG1 (consequently, ground is linked to the ground by a sufficiently weak impedance). The first voltage generator GT1 preferably has a low output impedance Z0, for instance very small with respect to approximately 100Ω, so as to be weak for the impedances of resistances R1, R2 and R3 and so as not to be large for the first characteristic impedance of pilot line LP. At the frequencies of the second analog signals SC. Indeed, this makes it possible not to attenuate too much the second analog signals SC that are injected into pilot line LP.

It is important to understand that an objective of the first voltage generator GT1 is to deliver a second analog signal SC that is not degraded by the presence at the level of its output of the impedances and voltages suitable for pilot line LP, in particular during the variations of the first analog signal SF.

The first filtering means MF1 are arranged to extract each second analog signal SC from the analog signals (SC+SF) that pass through pilot line LP.

When the frequency band of the second analog signals SC is situated above the first frequency band f1, the first filtering means MF1 is arranged to conduct a high-pass type filtering and the analysis module MA of the management means MGN is arranged to conduct a low-pass type filtering. One will understand that if the frequency band of the second analog signals SC was situated below the first frequency f1, the first filtering means MF1 would be arranged to conduct a low-pass type filtering, and the analysis module MA of the management means MGN would be arranged to conduct a high-pass type filtering.

The input impedance ZI of the first filtering means MF1 is preferably high, for instance greater than approximately 100 kΩ, so as to be large for the impedances of resistances R1, R2 and R3 so as not to modify the action of the latter (R1 to R3). In the case of the second analog signals SC for which the lowest frequency is equal to approximately 2 MHz, the first filtering means MF1 can for instance be 2 (12 dB/octave) and have a cut-off frequency of about 700 kHz.

Figure 6:
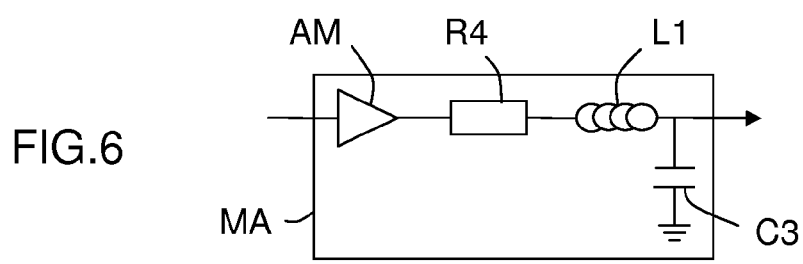
FIG. 6 illustrates schematically and functionally an example of an embodiment of the analysis means of the second system of FIG. 1.

One will notice that the filtering ensured by the analysis module MA can for instance be 2 and have a cut-off frequency of approximately 160 kHz. An example of a non-limiting embodiment of the analysis module MA is illustrated in FIG. 6. Reference MA designates an input amplifier. Reference R4 designates an in-series mounted resistance with the operational amplifier AM. Reference L1 designates an in-series mounted inductance with operational amplifier AM and resistance R4. Reference C3 designates a capacitive element in parallel between the output of inductance L1 and ground to form an RLC type circuit.

The filtering of order 2 or 1 (6 db/octave) permits a low-cost implementation. Better performance can be obtained with higher orders (or gradients) through a cost that can also be higher.

The second generation means MG2 is arranged to generate from each second extracted analog signal SC an analog signal that must be converted into a digital signal by the conversion means MC to be processed by the system Si (for instance by its processing means MTi).

To do so, and as illustrated without limitation in FIG. 1, the second generation means MG2 can comprise a second voltage generator GT2 and second interface means MI2 coupled one to the other.

The second voltage generator GT2 is arranged to generate a second analog signal and by differential example, an analog power line communication signal from a second analog signal SC extracted by the first filter means MF1 of pilot line LP.

Figure 5:
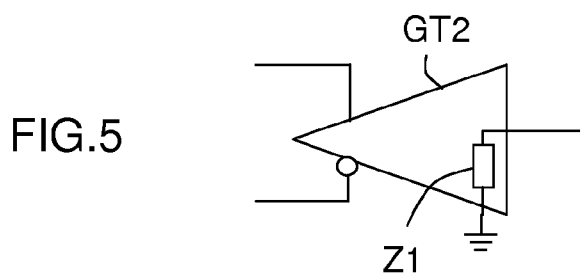
FIG. 5 illustrates schematically and functionally an example of an embodiment of the voltage generator of the second generation means of the communication devices of FIG. 1.

Such a second voltage generator GT2 can for instance include an amplifier presenting a setup of the type as the one illustrated in FIG. 5 (in other words with an equivalent input impedance Z1 mounted between its input terminal and ground).

One of the two differential outputs of the second voltage generator GT2, for instance that of the high I+, delivers an analog signal $V_{I+}$ referenced with respect to ground, while the other differential output of this second voltage generator GT2, for installation of the low I− (here inverting), delivers an analog signal $V_{I-}$ referenced with respect to ground.

If the output of the first filtering means MF1 delivers a second analog signal SC', then one has the relation SC'−GND=$V_{I+}$−$V_{I-}$.

The second interface means MI2 is arranged to generate an analog power line communication signal to be converted into a digital signal by the conversion means MC, from a second analog differential signal provided by the second voltage generator GT2. The second interface means MI2 can comprise a differential input. In this case, it is preferable that the output of the second voltage generator GT2 be also of the differential type.

For instance, the input impedance of the second interface means MI2 can be lower than or equal to approximately 150Ω, for reasons linked to the applications of the components considered on the power lines.

The first MI1 and second MI2 interface means can possibly constitute two sub-parts of an electronic component IF called by the expert in the field AFE or "Analog Front End".

In addition, the conversion means MC and the Analog Front End IF can possibly constitute two sub-parts of a power line modem MD (also called PLC chipset for "Power Line Communication chipset"), well-known to those skilled in the art.

One will observe that in an alternative embodiment, the first generation means MG1 might not include a first voltage generator GT1. In this case, one of the two differential outputs of the first MI1 interface means, for instance O−, can be linked to ground, so as to deliver directly the second analog signal SC on the other differential output of the first interface means MI1, for instance O+.

One will also observe that in an alternative embodiment, the second generation means MG2 might not include any second voltage generator GT2. In this case, one of the two differential inputs of the second interface means MI2 can be linked to ground so as to receive the analog signal SC' on the other differential input of the second MI2 interface means. The output impedance of the first filtering means MF1 must then take into account the input impedance RI of the second interface means MI2 which if it belongs to an AFE IF, is generally below 150 Ω.

The invention advantageously permits the reduction, or even practically suppression of crosstalk, by the fact that communications can from now on be considered as being "point-to-point". This results from the fact that the first and second signals are filtered at most interfaces that each Si system has with the outside, contrary to the technologies of the prior art where power line communications are applied to power lines which are generally interconnected electrically.

In addition, the invention is applicable to numerous types of power line communication technology in numerous frequency bands, situated between 80 kHz and 30 MHz.

The invention is not limited to the modes of embodiment of the communication and system device described above only as an example, but it covers all variants that the expert in the field may consider within the framework of the claims below.

The invention claimed is:

1. A power line communication device for a first system adapted to be coupled to a second system via a power cable comprising a pilot line having a first impedance, which encounters at least second and third impedances and through which flows a first analog signal in a first frequency band;
   wherein the device is arranged i) to generate from a local digital signal a second analog power line communication signal having frequencies comprised in a second frequency band overlapping as little as possible said first frequency band, ii) to feed said pilot line with said second analog signal via capacitive means, and iii) to extract analog signals passing through said pilot line each second analog signal to convert it into a digital signal to be processed by said first system; and
   wherein the device comprises i) conversion means adapted to convert an analog signal into a digital signal and vice-versa, ii) a first generation means adapted to generate each second analog signal from a local analog signal provided by said conversion means and to feed said capacitive means with each second analog signal generated, (iii) a first filtering means adapted to extract each second analog signal from the analog signal passing through said pilot line, and (iv) a second generation means adapted to generate from each second extracted analog signal an analog signal to be converted into a digital signal by said conversion means for its processing by said first system.

2. The device according to claim 1, wherein said capacitive means presents a fourth impedance that is less than said first, second and third impedances.

3. The device according to claim 1 wherein said first generation means comprises i) first interface means configured to generate a first analog differential power line communication signal from an analog signal provided by said conversion means and ii) a first voltage generator arranged to generate a second analog power line communication signal from a first analog differential signal generated by said first interface means and to feed said capacitive means with said generated second analog signal.

4. Device according to claim 1, wherein said second means of generation comprises i) a second voltage generator arranged to generate a second analog differential power line communication signal from a second analog signal extracted by said first filtering means and ii) a second interface means configured to generate an analog power line communication signal to be converted into a digital signal by said conversion means from a second analog differential signal provided by said second voltage generator.

5. The device according to claim 1, wherein said first filtering means is configured to extract from the analog signals passing through said pilot line second analog signals belonging to a second frequency band higher than said first frequency band.

6. A system suited to be coupled to a second system via a power cable comprising a pilot line having a first impedance, which encounters at least second and third impedances and through which flows a first analog signal in a first frequency band, wherein the system comprises a power line communication device according to claim 1 and which is adapted to be coupled to said pilot line.

7. The system according to claim 6, wherein the system comprises at least a part of a recharge terminal and in that it comprises generation means is configured to generate said first analog signal.

8. The system according to claim 6, wherein the system comprises processing means configured to provide local digital signals to be transformed into second analog signals to transmit, and to process digital signals resulting from the conversion of second analog signals extracted from said pilot line.

9. A system suited to be coupled to a second system via a power cable comprising a pilot line having a first impedance, which encounters at least second and third impedances and through which flows a first analog signal in a first frequency band, wherein the system comprises a power line communication device which is adapted to be coupled to said pilot line;
   wherein said power line communication device is arranged i) to generate from a local digital signal a second analog power line communication signal having frequencies comprised in a second frequency band overlapping as little as possible said first frequency band, ii) to feed said pilot line with said second analog signal via capacitive means and iii) to extract analog signals passing through said pilot line each second analog signal to convert it into a digital signal to be processed by said first system; and
   wherein the system comprises at least a part of a recharge terminal and generation means configured to generate said first analog signal; said generation means being arranged to generate a first analog signal of the so-called "Pulse Width Modulation" type and in which said pulse width is representative of the maximum value of a current that said recharge terminal is capable of providing.

10. The system according to claim 9 wherein said generation means is arranged to generate a first analog signal presenting a generally rectangular shape with rounded transitions.

11. The system according to claim 10 wherein said generation means comprises i) a generator arranged to generate a rectangular signal with the lowest frequency for said first frequency band, ii) a commutation means to modify the passage of the signal generated by said generator during a small part selected for each of the transitions so as to round them off, and (iii) a second filtering means arranged to apply low-pass filtering to the signal delivered by said commutation means in order to increase the duration of their rounded transitions.

12. The system according to claim 9, wherein the system comprises processing means configured to provide local digital signals to be transformed into second analog signals to transmit, and to process digital signals resulting from the conversion of second analog signals extracted from said pilot line.

13. A system suited to be coupled to a second system via a power cable comprising a pilot line having a first impedance, which encounters at least second and third impedances and through which flows a first analog signal in a first frequency band, wherein the system comprises a power line communication device which is adapted to be coupled to said pilot line;
   wherein said power line communication device is arranged i) to generate from a local digital signal a second analog power line communication signal having frequencies comprised in a second frequency band overlapping as little as possible said first frequency band, ii) to feed said pilot line with said second analog signal via capacitive means and iii) to extract analog signals passing through said pilot line each second analog signal to convert it into a digital signal to be processed by said first system; and wherein the system comprises at least a part of a vehicle, and that the system comprises a management means configured to extract from the analog signals flowing through said pilot line each first analog signal in order to deduct from the latter the maximum value of a current that said second system is capable of providing to said system and to authorize or prohibit this provision of current at least on the basis of this deducted maximum value.

14. The system according to claim 13, wherein said managements means is arranged to manage the supply of power to at least a rechargeable electric battery that is part of said vehicle.

15. The system according to claim 13, wherein the system comprises processing means configured to provide local digital signals to be transformed into second analog signals to transmit, and to process digital signals resulting from the conversion of second analog signals extracted from said pilot line.

* * * * *